United States Patent
Helt et al.

(10) Patent No.: US 6,759,868 B2
(45) Date of Patent: Jul. 6, 2004

(54) CIRCUIT AND METHOD FOR COMPENSATION IF HIGH-FREQUENCY SIGNAL LOSS ON A TRANSMISSION LINE

(75) Inventors: Christopher G. Helt, Ft. Collins, CO (US); Guy Marian Humphrey, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 147 days.

(21) Appl. No.: 09/795,834

(22) Filed: Feb. 27, 2001

(65) Prior Publication Data

US 2002/0118042 A1 Aug. 29, 2002

(51) Int. Cl.[7] .............................................. H03K 17/16
(52) U.S. Cl. .............................. 326/30; 326/26; 326/87
(58) Field of Search ............................. 326/26, 27, 30, 326/31, 32, 86, 87

(56) References Cited

U.S. PATENT DOCUMENTS

| | | | | |
|---|---|---|---|---|
| 5,039,874 A | * | 8/1991 | Anderson | 307/270 |
| 5,528,166 A | * | 6/1996 | Iikbahar | 326/27 |
| 5,898,321 A | * | 4/1999 | Ilkbahar | 326/87 |
| 5,963,047 A | * | 10/1999 | Kwong et al. | 326/27 |
| 6,242,942 B1 | * | 6/2001 | Shamarao | 326/27 |
| 6,420,899 B1 | * | 7/2002 | Crittenden et al. | 326/30 |

* cited by examiner

Primary Examiner—Anh Q. Tran

(57) ABSTRACT

A circuit and method that maintains the impedance matching characteristics of a common output driver while compensating for the high-frequency signal attenuation inherent in printed circuit board traces and other integrated circuit signal transmission media are disclosed. The circuit includes a pre-emphasis driver configured in parallel with a standard output driver. The pre-emphasis driver is a tri-statable device which mirrors a received logic input when in an "on" state and provides a high output impedance with no signal content when in an "off" state. The pre-emphasis driver is controlled by a pre-emphasis control signal configured such that the pre-emphasis driver can inject high-frequency signal components into a transmission line for a portion of a clock cycle. The pre-emphasis control signal is configured such that the pre-emphasis driver turns "on" in close approximation with data signal transitions and is turned "off" before a reflected signal caused by the impedance mismatch between the pre-emphasis driver and downstream elements (i.e., a transmission line and a receiver) appears at the parallel driver output. In its broadest terms the method includes: providing a data signal at a matched-impedance driver; placing a low-impedance driver in parallel with the matched-impedance driver; using a control signal to turn "on" the low-impedance driver when the data signal transitions and turn "off" the low-impedance driver before an impedance mismatch induced reflected signal returns at the output of the matched-impedance driver.

28 Claims, 6 Drawing Sheets

NOTE: IMPEDANCE MISMATCH INDUCED REFLECTIONS MAY BE POSITIVE OR NEGATIVE DEPENDING ON THE MISMATCH.

CIRCUIT AND METHOD FOR COMPENSATION IF HIGH-FREQUENCY SIGNAL LOSS ON A TRANSMISSION LINE

BACKGROUND OF THE INVENTION

1. Field of the Invention

The present invention generally relates to integrated circuit output drivers. More specifically, the invention relates to both a circuit and a method for adjusting signal transmission parameters of a signal designated for transmission from a first integrated circuit to a second integrated circuit.

2. Discussion of the Related Art

Integrated circuits (ICs) are electrical circuits which incorporate transistors, resistors, capacitors, and other components onto a single semiconductor "chip" in which the components are interconnected to perform a given function. Typical examples of ICs include microprocessors, programmable logic devices (PLDs), electrically erasable programmable memory devices (EEPROMs), random access memory devices (RAMs), operational amplifiers, voltage regulators, and others. Generally, ICs incorporate chip pins, which are configured for enabling electrical interconnection of external electronic components, such as other ICs, high-power amplifiers, discrete external circuit components, and other similar devices. IC electrical interconnection points may be physically and electrically fixed to a printed circuit board via a plurality of solder contact points or pads, which in turn are electrically coupled to a plurality of printed circuit board conductors commonly known as traces. Alternatively, for higher frequency applications using a flip-chip or bump chip, a plurality of solder columns or solder bumps strategically located on the die may be used to provide the physical and electrical interface between the various circuit components on the die and external circuit elements (i.e., other semiconductor dies, ICs, or other such devices). The printed circuit board traces, or IC packages in the case of high-frequency circuit applications, provide a transmission media for input and output signals to and from each IC. In addition, the printed circuit board traces or IC packages may serve to supply any necessary power and electrical ground references to the ICs.

Figure 1A:
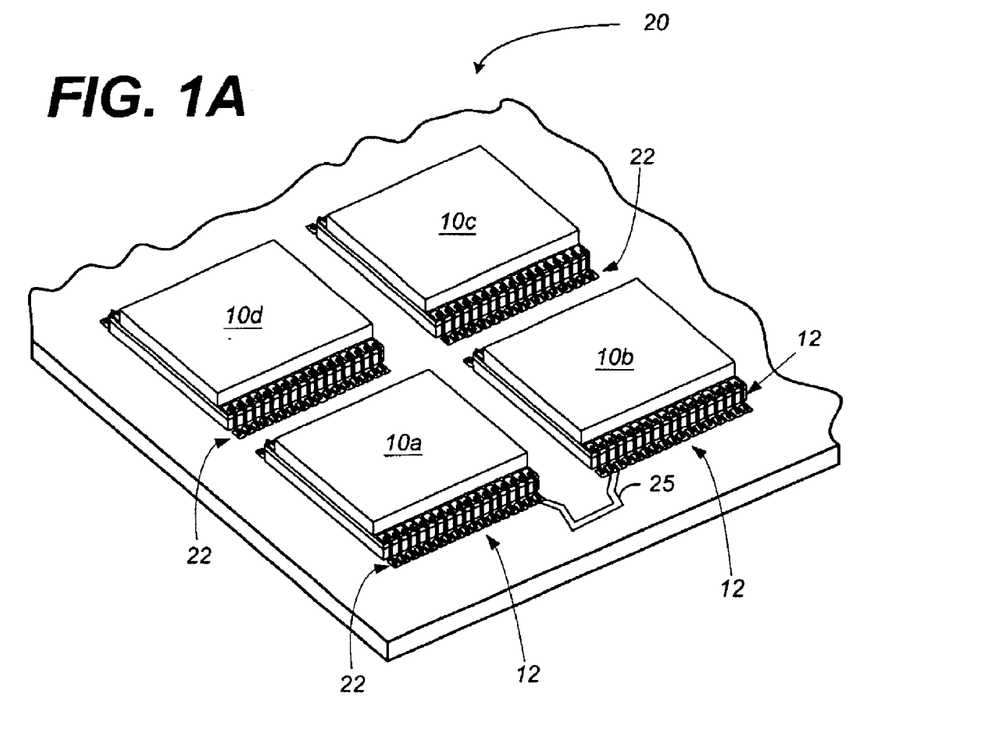
FIG. 1A is a perspective view of an exemplary printed circuit board having a plurality of ICs and a printed circuit board trace for interconnecting various ICs.

An exemplary configuration is illustrated in FIG. 1A. In this regard, the figure shows a portion of a printed circuit board 20 having a plurality of contact pads 22 arranged to receive a plurality of ICs 10a–10d. Generally, as illustrated in FIG. 1A, a plurality of IC pins 12 are electrically and physically associated via the plurality of printed circuit pads 22. As further illustrated in FIG. 1A, a printed circuit board trace 25 may be provided along the upper or lower surface of the printed circuit board 20 or between two or more printed circuit board layers routed to one or both surfaces using a via in order to communicatively couple one or more IC pins 12 from a first IC 10a to designated circuits and/or circuit components external to the first IC 10a. For example, in FIG. 1A, the right most pin 12 associated with IC 10a is coupled to the second pin from the left associated with IC 10b via the printed circuit board trace 25.

Figure 1B:
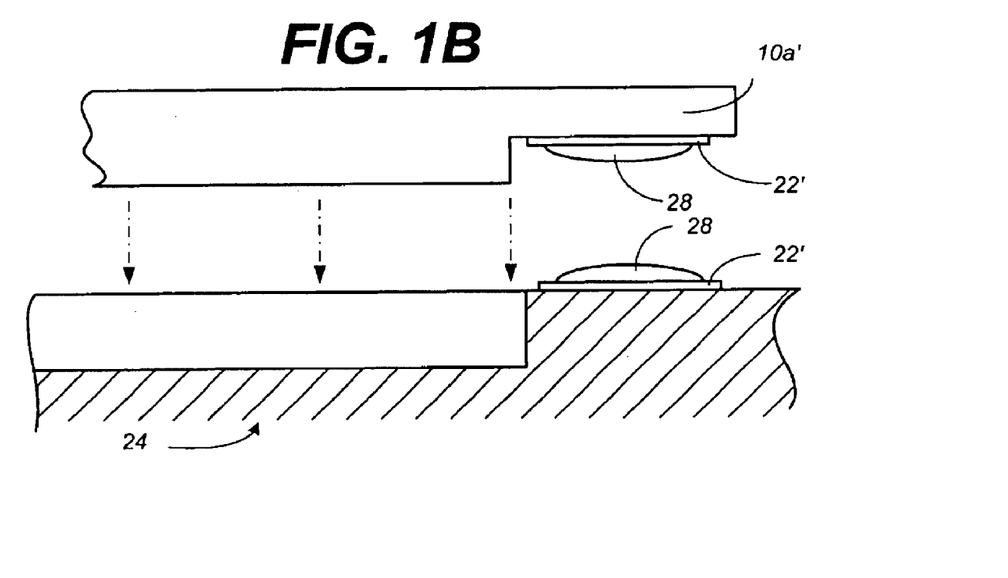
FIG. 1B is a cross-sectional view of an exemplary flip-chip having a plurality of ICs and a ball-grid array for physically and electrically interconnecting various circuits on the flip-chip to circuits on other ICs.

An IC output driver is typically configured for providing signals designated for transmission to the aforementioned external circuits or circuit components. The IC output driver supplies an amplified version of the signals to be communicated to one or more external devices to a chip pin associated with the IC. It will be appreciated that for high-frequency applications it may be desirable to reduce the number of possible impedance transitions that may confront a particular signal. As previously explained, a semiconductor die may be interconnected to an IC package using a plurality of strategically placed solder columns or solder bumps to physically and electrically connect the various circuits on the die to the IC package. Such an arrangement is illustrated in FIG. 1B. In this regard, FIG. 1B illustrates a cross-sectional view representing the assembly of a flip-chip 10a' to an open cavity ball-grid array 24. As illustrated, the flip-chip 10a' may contain one or more (one shown for simplicity of illustration) contact pads 22' each having its own solder bump 28. Similarly, the ball-grid array 24 may be configured with one or more spatially separated contact pads 22' each having its own solder bump 28. The flip-chip 10a' may be placed in substantial contact alignment with the open cavity ball-grid array 24. Heat may then be applied such that the one or both of the solder bumps 28 reaches a melting point. Once the heat is removed and the one or more solder bumps 28 cools, the flip-chip 10a' is both physically and electrically interconnected to the ball-grid array 24. It will be appreciated that internal conductors within the flip-chip 10a' die, the contact pads 22', the solder bumps 28, along with the associated elements and electrical conductors on the ball-grid array 24 form the transmission media for IC to IC signal transfers. As is known, the ball-grid array 24 may provide a plurality of conductors suitably configured to supply each of the one or more interface signals to pre-designated locations on one or more separate and distinct semiconductor dies.

Figure 2:
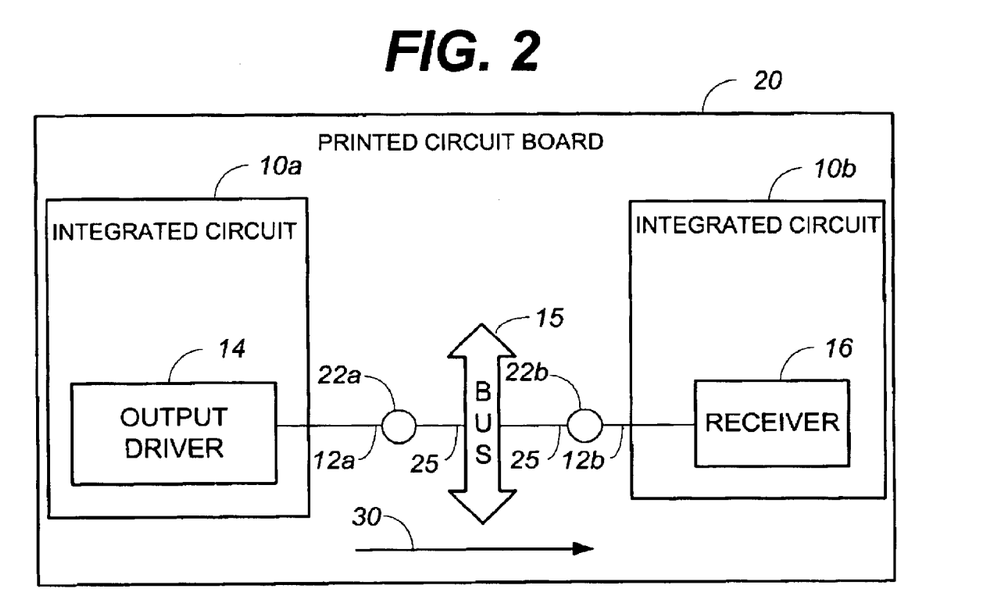
FIG. 2 is a functional block diagram further illustrating the interconnection of clock and data signals between various ICs on the printed circuit board of FIG. 1A.

The block diagram of FIG. 2 further illustrates an IC to IC signal transfer. As presented in FIG. 2, a first IC 10a affixed to the printed circuit board 20 may be electrically coupled to a second IC 10b as follows. An output driver 14 configured to amplify a signal 30 may supply the amplified signal 30 via a first IC pin 12a to a first printed circuit pad 22a. The first printed circuit pad 22a may be electrically coupled to the printed circuit board trace 25, which may be further coupled to a second printed circuit pad 22b. As illustrated in FIG. 2, the second printed circuit pad 22b may be coupled to a second IC pin 12b associated with the second IC 10b. More specifically, the second IC pin 12b may be coupled to a designated receiver 16 within the second IC 10b. As further illustrated in the block diagram of FIG. 2, the IC to IC signal transfer is not point to point limited. In this example, a single output driver 14 to receiver 16 transfer is illustrated. It will be appreciated that a bus 15 may be coupled to the printed circuit board trace 25, which may further distribute the amplified signal 30 to various devices throughout the printed circuit board 20. The distribution of the amplified signal 30 from the first IC 10a to the second IC 10b via the IC pins 12, the printed circuit pads 22, and the printed circuit board trace 25 may be modeled using transmission line theory.

The electrical connection described above with regard to the block diagram of FIG. 2, contains parasitic resistance, inductance, and capacitance, which interfere with the transmission of the signal 30 from the output driver 14 to the receiver 16. The parasitic interference increases the load seen by the output driver 14. Transmission line theory teaches that for transmission lines having a finite length terminated in a non-characteristic impedance, time-varying signals transmitted along the transmission line may suffer from reflected signals. Conversely, for time-varying signals transmitted along transmission lines of a finite length terminated in the characteristic impedance of the transmission line, the reflected signals will vanish.

Figure 3:
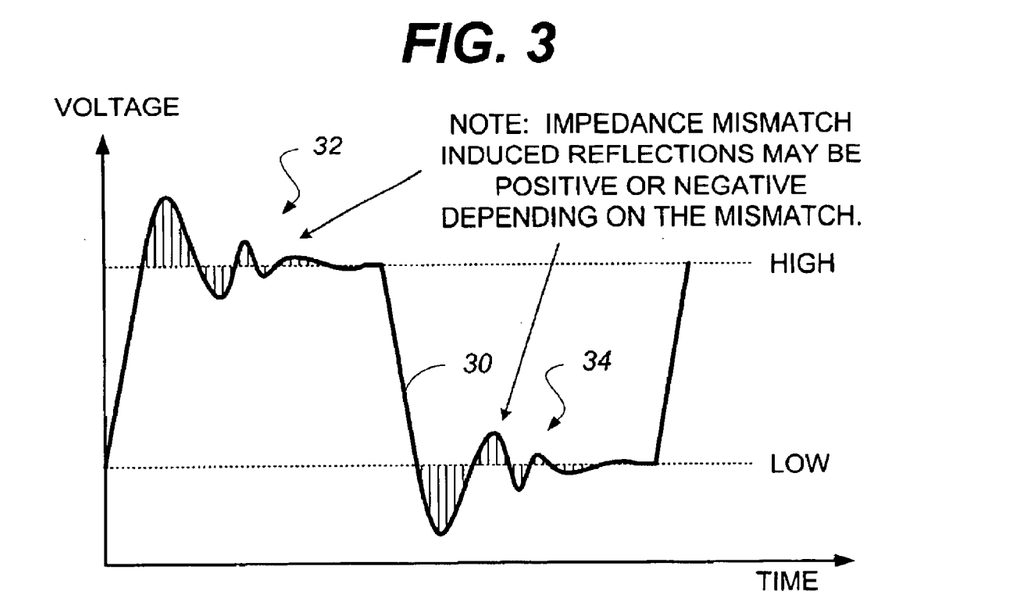
FIG. 3 is a graph depicting representative signal reflections that may be observed on the transmitted signal of FIG. 2.

Impedance mismatches between the output driver 14 and the various signal transmission media of the signal transmission path, as well as, between the receiver 16 and the various signal transmission media of the signal transmission path may produce signal reflections at the output driver end and/or the receiver end of the signal transmission path. These signal reflections may propagate along the transmission path and may potentially result in less than desired system performance. A representative signal 30 including such signal reflections, i.e., reflections 32 and 34, is depicted in FIG. 3. Such reflections may cause additional noise and ringing (i.e., excessive transient voltage swings). Under some impedance mismatch conditions, signal reflections will become so severe as to result in incorrect data transmissions between the output driver 14 (FIG. 2) and the receiver 16 (FIG. 2).

From circuit theory it is known that a maximum transfer of power from a given voltage source to a load occurs when the load impedance is the complex conjugate of the source impedance. In transmission line terminology, a line is "matched" and is most efficient when the load impedance is equal to the characteristic impedance of the transmission line. As a result, it is highly desirable to closely match the output impedance of the output driver 14 to the various components comprising the conductive pathway, hereinafter the transmission line (e.g., the IC pins 12, the printed circuit pads 22, and the printed circuit board trace 25 of FIG. 2), and the input impedance of the receiver 16. Because of the parasitic resistance, inductance, and capacitance present within the transmission line, the output driver 14 is preferably designed to avoid excessive voltage swings when switching occurs (particularly for high speed or low-power I/O signal transmissions). Generally, output drivers 14 are designed for an output impedance of 50 Ohms to match the characteristic impedance of the printed circuit board trace 25 (FIGS. 1 & 2), which will transfer the signal to various destination devices.

Due to process variations inherent in the manufacturing process of ICs, individual ICs designed and intended to perform the same function can vary significantly. As a result, it is difficult to manufacture output drivers 14 with consistent output impedance. For example, the doping level, the length of channels in FETs, the thickness of the gate oxide for transistors, the diffusion resistance, and other characteristics associated with each individual IC vary during the manufacturing process. In other words, two supposedly identical ICs can vary in all of these characteristics. As these characteristics approach the ideal case the resistance of many components within a chip decrease. In the opposite extreme, as the IC characteristics stray further and further from the ideal case, the performance of the circuit degrades. Specifically, the resistance of the many components within the chip increases, which slows the response time of the IC.

In addition to manufacturing variation, a number of environmental factors may adversely affect IC performance. For example, supply voltage and ambient temperature can adversely effect individual ICs. More specifically, when an IC's temperature approaches a maximum operating temperature the resistance of the FETs in the IC increases, which in turn leads to a decrease in efficiency and slower response times. Furthermore, when an IC's supply voltage sags, as may occur in tandem with increases in ambient temperature, the IC's response times may slow further.

Figure 4A:
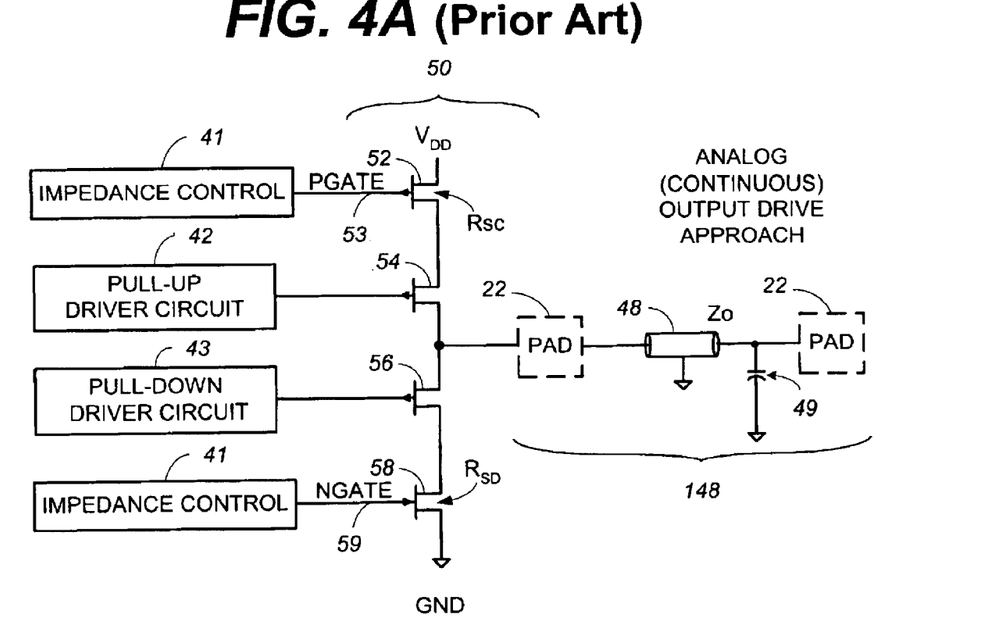
FIG. 4A presents a schematic diagram depicting a prior art circuit configuration for controllably adjusting the output impedance of a driver to reduce the representative signal reflections of FIG. 3.

One prior art approach to address operational problems introduced by manufacturing process variation and environmental factors such as supply voltage and ambient temperature is to provide a programmable output driver stage in a CMOS output driver. One such circuit is illustrated in FIG. 4A. The figure shows dual impedance controls 41 (e.g., programmable current sources, which serve to control the impedance of FETs 52 and 58) and a dual output driver 50. The dual output driver 50 drives a capacitively terminated transmission line 48. The transmission line 48 may be further identified by a characteristic impedance of "Zo." As illustrated in FIG. 4A, the pads 22, the capacitively terminated transmission line 48, the various electrical conductors connecting these an any other elements in a signal transmission path may be modeled as a composite transmission line 148.

Returning to the CMOS output driver, the dual impedance controls 41 determine a composite source impedance for the dual output driver 50. The composite source impedance can be separated into a value $R_{SC}$ (the source resistance while charging) and a value $R_{SD}$ (the source resistance while discharging). Generally speaking, it is desirable that $R_{SC}$ and $R_{SD}$ be equal to each other and to the characteristic impedance Zo of the transmission line 48, although one can imagine that there might be special circumstances that would require them to be different.

Note the capacitive load 49 at the destination end of transmission line 48. The system may employ a well-understood technique of doubling the output voltage by using reflected power from the reactive (and non-power dissipative) discontinuity (i.e., the capacitive load 49) at the terminus of the transmission line 48. It is desirable to achieve the full doubling effect without added overshoot (i.e., the case where Zo is too low, which can lead to multiple reflections) or excessive rise time (i.e., the case where Zo is too high, which can lead to multiple reflections). Note that when the load is reactive, the power that is launched by charging through $R_{SC}$ is transmitted through Zo, reflected (i.e., the load voltage is doubled), transmitted back through Zo and then absorbed by discharging, without re-reflection by the source resistance, $R_{SC}$. A similar sequence of events occurs for discharging involving $R_{SD}$. (All provided, of course, that $R_{SC}$=Zo=$R_{SD}$.) Yet even in a situation where there is a resistive termination with the expectation of genuine power transfer to the load without reflection, it is still important to control the source impedance of the output driver stages.

To appreciate the operation of the CMOS device, consider output driver stage 50, which includes four CMOS devices 52, 54, 56, and 58 connected as shown. Devices 54 and 56 act as switches to respectively pull-up (charge to $V_{DD}$) and pull-down (discharge to GND) the signal that drives the transmission line 48 whose characteristic impedance, Zo, is to be matched by $R_{SC}$ (during pull-up) and by $R_{SD}$ (during pull-down). It will be understood that switching devices 54 and 56 are driven "on" and "off" in a suitable scheme in accordance with the desired output waveform, and that although both devices 54 and 56 may be "off" simultaneously, both devices will never be on at the same time. In this regard, driver circuits 42 and 43 are provided to turn the switching devices 54 and 56 "on" and "off." Generally, and as is known, one driver circuit 42 operates to control the FET 54 to drive the output signal from a low to high value, while a second driver circuit 43 operates to control the FET 56 to drive the output signal from a high to low value.

Device 52 acts as a resistance of programmable value to combine with the very low on resistance of device 54 to produce $R_{SC}$. Similarly, device 58 acts as a resistance of programmable value to combine with the relatively low "on" resistance of device 56 to produce $R_{SD}$. The resistance of device 52 is controlled by the value of the voltage PGATE 53, while in similar fashion the resistance of device 58 is determined by the value of the voltage NGATE 59. Assuming now that the P-type device 52 and N-type device 58 have generally equal transconductance, the signals NGATE 59 and PGATE 53 are controlled such that they (1) can be externally varied to adjust $R_{SC}$ and $R_{SD}$ over a suitably wide range of Zo despite process variations; (2) vary together such that as NGATE increases from GND toward $V_{DD}$, PGATE 53 decreases correspondingly from $V_{DD}$ toward GND; and (3) automatically adjust to compensate for the effects of temperature.

Figure 4B:
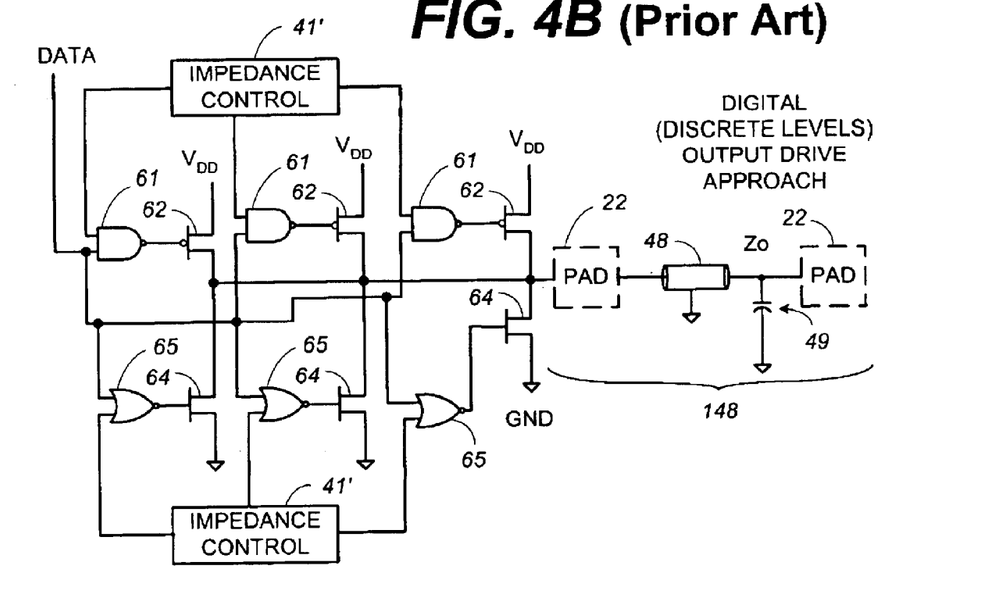
FIG. 4B is a schematic diagram depicting an alternative circuit configuration for controllably adjusting the output impedance of a driver to reduce the representative signal reflections of FIG. 3.

Another common approach used to address operational problems introduced by manufacturing process variation and environmental factors is to configure multiple fingers in parallel using a digital logic scheme. One such circuit is illustrated in FIG. 4B. The figure shows dual digital impedance controls 41', which serve to control the on/off state of NAND gates 61 or NOR gates 65. The on/off state of the NAND gates and NOR gates 65, together with the logic level of the input data, form an output driver suited to drive a capacitively terminated transmission line 48. The transmission line 48 may be further identified by a characteristic impedance of "Zo." As illustrated and explained with regard to the analog approach introduced in the circuit of FIG. 4A, the pads 22, the capacitively terminated transmission line 48, the various electrical conductors connecting these an any other elements in a signal transmission path may be modeled in the digital approach as well as a composite transmission line 148.

Returning attention to the digital output driver, the dual impedance controls 41' determine a composite source impedance for the output driver. As in the analog or continuous output drive approach of the circuit in FIG. 4A, the composite source impedance can be separated into a value $R_{SC}$ (the source resistance while charging) and a value $R_{SD}$ (the source resistance while discharging).

The output driver of FIG. 4B includes three pairs of matched devices 62, 64 connected as shown. Devices 62, 64 act as switches to respectively pull-up (charge to $V_{DD}$) and pull-down (discharge to GND) the signal that drives the transmission line 48 whose characteristic impedance, Zo, is to be matched during pull-up and during pull-down. It will be understood that switching devices 62, 64 are driven "on" and "off" in a suitable scheme in accordance with the desired output waveform, and that although both devices 62 and 64 may be "off" simultaneously, both devices will never be "on" at the same time.

Operationally, the circuit of FIG. 4B functions as follows. When the input data is logically high and the corresponding impedance control input is high, the associated NAND gate 61 will drive its corresponding PFET 62 "on." For those times when the input data signal is logically low and the corresponding impedance control input is low, the associated NOR gate 65 will drive its corresponding NFET "on." By controllably turning "on" and "off" the NAND gates 61 and the NOR gates 65, the output impedance of the output driver may be adjusted. It should be appreciated that the responsiveness of the digital implementation illustrated in FIG. 4B will be greater than that of the analog implementation of FIG. 4A as there is a single FET between the supply voltage, $V_{DD}$, and signal ground vs. the analog case where 2 FETs appear between the supply voltage and signal ground. It should be further appreciated that the sensitivity of each of the discrete impedance levels that result from adding each additional FET is dependent on the length of each respective FET junction.

In order to meet the high-speed performance requirements of modern ICs and the systems they support it is desirable to produce ICs that can support fast data transition times. Unfortunately, as IC clock and data signal rates approach and transition through the ultra-high frequency (UHF) range of the radio frequency spectrum (i.e., from 300 MHz to 3 GHz) the transmission lines themselves may behave as circuit elements. More specifically, at these frequencies sections of transmission lines can be designed to provide an inductive or capacitive impedance in order to match a particular expected load to enable maximum power transfer. More importantly, as IC clock and data signal rates increase the transmission lines increasingly attenuate the clock and data signals.

One prior-art approach to overcoming the high-frequency attenuation inherent within printed circuit board traces 25 is to increase the strength of the output driver. While this approach results in faster transition times or edge rates, the approach is undesirable in that as driver strength is increased, the output driver output impedance strays significantly from the generally desired 50 Ohms (i.e., the characteristic impedance of a typical printed circuit board trace 25). The increase in the impedance mismatch leads to an increase in the magnitude of the reflected signals, which in turn increases the noise and ringing of the transmitted signal 30 (FIGS. 2 & 3).

Accordingly, there is a need for an improved circuit and method for addressing the inherent transmission line induced high-frequency attenuation while retaining the benefits of an output impedance matched output driver.

SUMMARY OF THE INVENTION

In light of the foregoing, the invention relates to a circuit and method that maintains the impedance matching characteristics of a common output driver while compensating for the high-frequency signal attenuation inherent in printed circuit board traces, line bonding conductors, and integrated circuit (IC) packages. In a preferred embodiment, the circuit includes a pre-emphasis driver configured in parallel with a standard output driver. The pre-emphasis driver is a low-impedance driver configured as a tri-statable device which mirrors a received logic input when in an "on" state (i.e., the pre-emphasis driver output mirrors the same logical sense as the standard driver.) When the pre-emphasis driver is in an "off" state, no output signal is present from the pre-emphasis driver and the pre-emphasis driver provides a high-impedance to signals reflected from destination devices and/or the transmission line. In accordance with a preferred embodiment, the pre-emphasis driver is controlled by a pre-emphasis control signal configured such that the pre-emphasis driver can inject high-frequency components into a transmission line for a portion of a clock cycle. The pre-emphasis control signal is configured such that the pre-emphasis driver turns "on" in close approximation with data signal transitions from the standard driver and is turned "off" before a reflected signal caused by the impedance mismatch between the pre-emphasis driver and downstream elements (i.e., the transmission line and the receiver) appears at the parallel driver output.

A method for providing high-frequency compensation for data and clock signals is also disclosed. In its broadest terms, the method can be described as: providing a data signal at the input of a matched-impedance driver; configuring a low-impedance driver in parallel with the matched-impedance driver; providing a control signal to the low-impedance driver such that the low-impedance driver is turned "on" when the data signal transitions and turned "off" before an impedance mismatch induced reflected signal returns at the output of the matched-impedance driver. The method for providing high-frequency compensation for data and clock signals outlined above results in a faster transition at receiving devices, while maintaining an impedance match at the output of improved driver.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The present invention, as defined in the claims, can be better understood with reference to the following drawings. The drawings are not necessarily to scale, emphasis instead being placed on clearly illustrating the principles of the present invention. In the drawings:

DETAILED DESCRIPTION OF THE PREFERRED EMBODIMENTS

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 5:
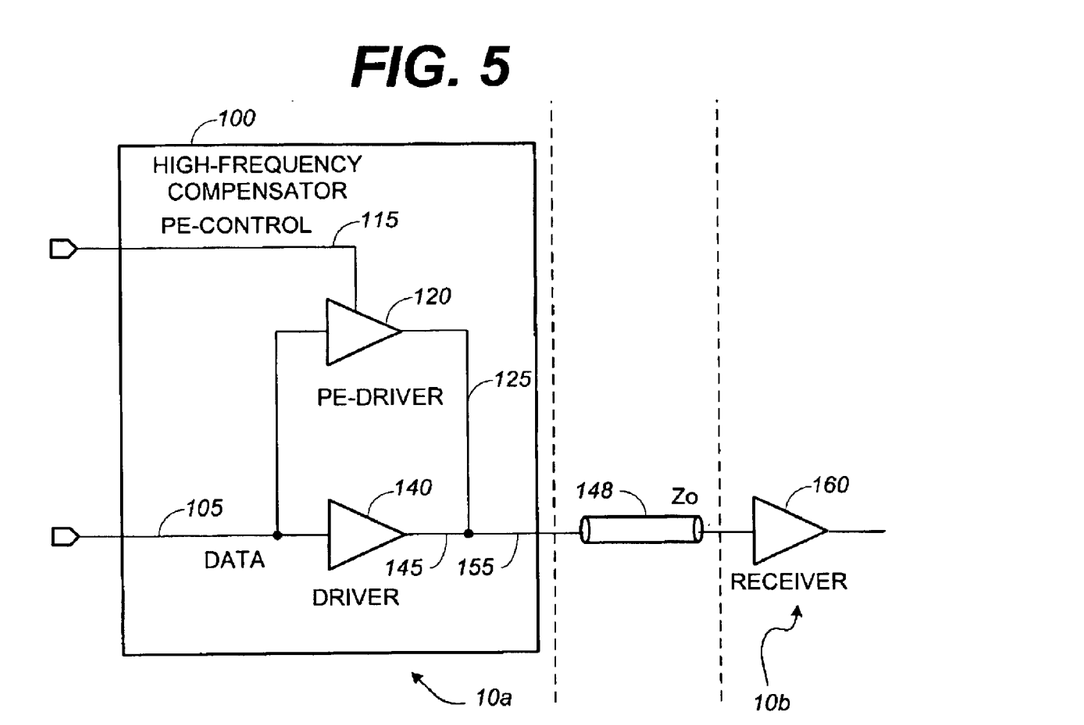
FIG. 5 is a functional block diagram illustrating a circuit configuration of a high-frequency compensator consistent with the present invention.

Turning now to the drawings, wherein like referenced numerals designate corresponding parts throughout the drawings, reference is made to FIG. 5, which illustrates a functional block diagram illustrating the circuit configuration of a high-frequency compensator consistent with the present invention. In this regard, a high-frequency compensator 100 may be configured on a first IC 10a interconnected with a second IC 10b via a signal transmission media that may be modeled by a composite transmission line 148. The high-frequency compensator 100 may comprise a first driver 140 and a pre-emphasis driver 120 (i.e., the pre-driver). The high-frequency compensator 100 may be provided a data signal 105 and a pre-control signal 115. In response to both the data signal 105 and the pre-control signal 115, the high-frequency compensator 100 may generate a high-frequency compensated output signal 155. As shown in FIG. 5, the high-frequency compensated output signal 155 may comprise both a first driver output 145 and a pre-driver output 125.

As illustrated in FIG. 5, the pre-driver 120 is electrically coupled in parallel with the first driver 140. In accordance with a preferred embodiment, the first driver 140 is a standard driver configured with output impedance that matches the characteristic impedance, $Z_O$, of the composite transmission line 148 (i.e., the complete set of elements used to form a signal transmission medium from the first IC 10a to the second IC 10b) and a designated receiver 160. Conversely, the pe-driver 120 may be configured such that it has low output impedance when it is in an "on" state and a high output impedance when it is in an "off" state. In accordance with the present invention, the on/off status of the pre-driver 120 may be manipulated by the pe-control input 115. As shown in the figure, the high-frequency compensated output signal 155 may be distributed via the composite transmission line 148 (e.g., the IC pins 12, the printed circuit pads 22, and the printed circuit board trace 25 of FIG. 2) to a designated receiver 160. While the present invention is directed to high-frequency compensation of IC to IC signal transmissions, it will be appreciated that the teachings and concepts of the present invention may be also be applied to the case where the receiver 160 is configured on the same IC as the driver 140 and the composite transmission line 148 is formed by a conductive layer associated with the IC. It will be further appreciated by those skilled in the art that the teachings and concepts of the present invention may be applied to driver configurations wherein the composite transmission line 148 is associated with a bus 15 (FIG. 2) and to transmission media other than a printed circuit board trace 25 (FIGS. 1A, 1B, & 2). It should be noted that where the characteristic impedance of the designated receiver(s) 160 and/or the characteristic impedance of the transmission media vary, the output impedance of the driver 140 should vary accordingly.

Figure 6:
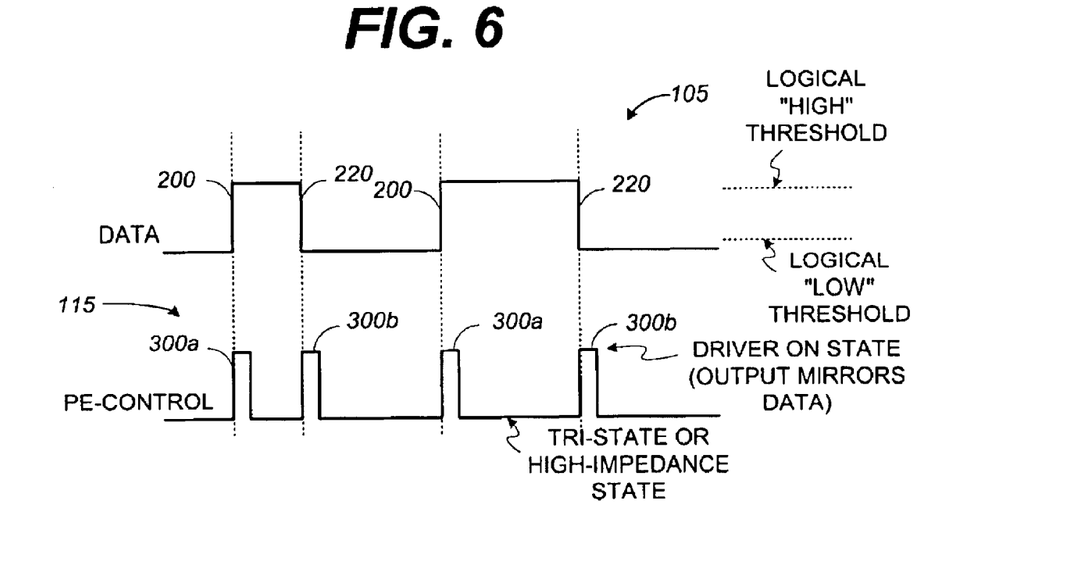
FIG. 6 is a timing diagram that illustrates the preferred relationship of the pre-emphasis control signal to the data signal of FIG. 5.

Having generally described the high-frequency compensator 100 and its operation with regard to the functional block diagram of FIG. 5, reference is now directed to FIG. 6, which presents a timing diagram that illustrates the preferred relationship of the pe-control signal 115 to the data signal 105 applied to the high-frequency compensator 100 of FIG. 5. In this regard, the timing relationship comprises a data signal 105 that may be applied to the driver 140 (FIG. 5) to amplify the data signal 105 prior to distribution to the receiver 160 (FIG. 5). As shown in FIG. 6, the data signal 105 may comprise a number of signal level transitions over time. Generally, the signal level transitions are such that the signal voltage exceeds a logical high threshold or a logical low threshold for significant portions of a clock cycle. Signal level transitions may occur in two ways. A rising-edge signal level transition 200 occurs when the data signal 105 transitions from a logical low voltage level to a logical high voltage level. Conversely, falling-edge signal transitions 220 occur when the data signal 105 transitions from a logical high voltage level to a logical low voltage level. It is significant to note that this methodology also works for inverting drivers.

In accordance with a preferred embodiment of the high-frequency compensator 100 (FIG. 5), the pe-control signal 115 is applied to the pe-driver 120 (FIG. 5) such that the pe-driver is turned "on" for a brief period of the time that starts substantially concurrently with a data transition of the data signal 105. As illustrated in FIG. 6, the pe-control signal 115 may be configured to apply an "on" state pulse 300a that coincides with rising-edge signal level transitions 200 and an "on" state pulse 300b that coincides with falling-edge signal transitions 220. As further illustrated in the timing relationship of FIG. 6, the pe-control signal 115 is configured such that the "on" pulse 300 is removed (i.e., the pe-driver 120 is turned "off") for a significant duration of time prior to the next data transition. More importantly, the pe-driver control signal 115 is configured such that the pe-driver 120 (FIG. 5) is turned "off" before a reflected signal returns to the output stage of the driver 140 (FIG. 5). It is significant to note that the timing relationship of FIG. 6 is offered by way of example only to describe the general nature of the pe-control signal 115 and the associated "on" pulse(s) 300. Practically, the pe-control signal 115 may require tuning to ensure that the pe-driver output 125 signal is aligned with the rising and falling edge transitions 200, 220 respectively of the input data signal 105.

Figure 7A:
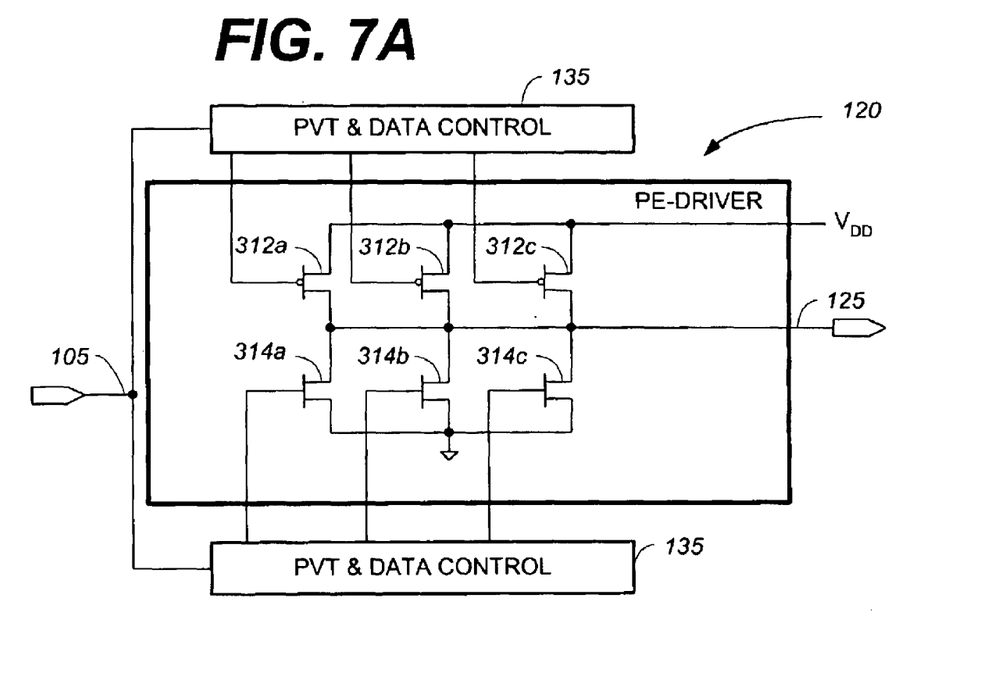
FIG. 7A is a circuit schematic of a preferred embodiment of the pre-emphasis driver of FIG. 5.

Having briefly described the timing relationship between the pe-control signal 115 and the input data signal 105 (FIG. 5) with regard to the exemplary timing diagram of FIG. 6, reference is now directed to FIG. 7A, which presents a circuit schematic of a preferred embodiment of the pre-emphasis driver 120 of FIG. 5. In this regard, a preferred embodiment of the pe-driver 120 may comprise a FET network as shown in FIG. 7A. The FET network provides a controllably variable impedance, which serves to vary the output impedance of the pe-driver 120 to match a transmission line characteristic impedance. The impedance provided by the FET network may be controlled by one or more process, voltage, and temperature (PVT) compensation signals supplied in response to the data signal 105 and present high-frequency compensator 100 (FIG. 5) circuit and environmental conditions. These control signals may turn selected FETs in the FET network "on" or "off." The output of the FET network is routed to the output of the first driver 145 (FIG. 5) via the pe-driver output conductor 125.

Specifically, the FET network is shown in relation to the data input 105, the pe-driver output 125, and the PVT & data controller 135. The FET network includes a plurality of PFET devices 312 and a plurality of NFET devices 314 electrically connected in parallel. Each of the FETs 312, 314 may be defined by a channel width that defines the conductance (and therefore resistance) of the particular FET device 312, 314. When turned "on," each FET passes the voltage from the input data signal 105 as provided by the PVT & data controller 135 to the pe-driver output 125. When more than one of the FET devices 312, 314 is turned "on," they act like resistors, combining in parallel to provide a lower resistance. In this way, the output impedance of the driver circuit is varied. Preferably, the FET devices 312, 314 are designed to have progressively decreasing channel widths, and more specifically, channel widths that decrease by a factor of two. Thus, for example, the channel width of a select PFET 312a may be some value, X, the channel width of a second PFET 312b may be approximately ½ X, the channel width of PFET 312c approximately ¼ X, and so on. It is significant to note that the scheme introduced above for varying the channel width of the various FET devices 312, 314 is representative of a binary weighted impedance control scheme. It will be appreciated that there are a host of suitable relationships that may be applied to the various FET device channel widths in order to achieve a number of desired impedance control effects. For example, the various FET device channel widths may be varied by a ratio other than two and adjusted by a suitably configured ratio code. In another example, the plurality of FET devices 312, 314 may be controllably adjusted using a thermometer code. These and other schemes for varying the various FET device channel widths are deemed within the scope of the present invention.

In accordance with the aforementioned control schemes, the collective outputs from the PVT & data controller 135 may serve as a digital control word to turn "on" selected FET devices 312, 314 to precisely control the output impedance of the pe-driver 120. It will be appreciated that the circuitry or logic of the PVT & data controller 135 (not shown) will be dependent upon process, voltage, and temperature (PVT), but need not be described herein to appreciate the teachings and concepts of the present invention.

Figure 7B:
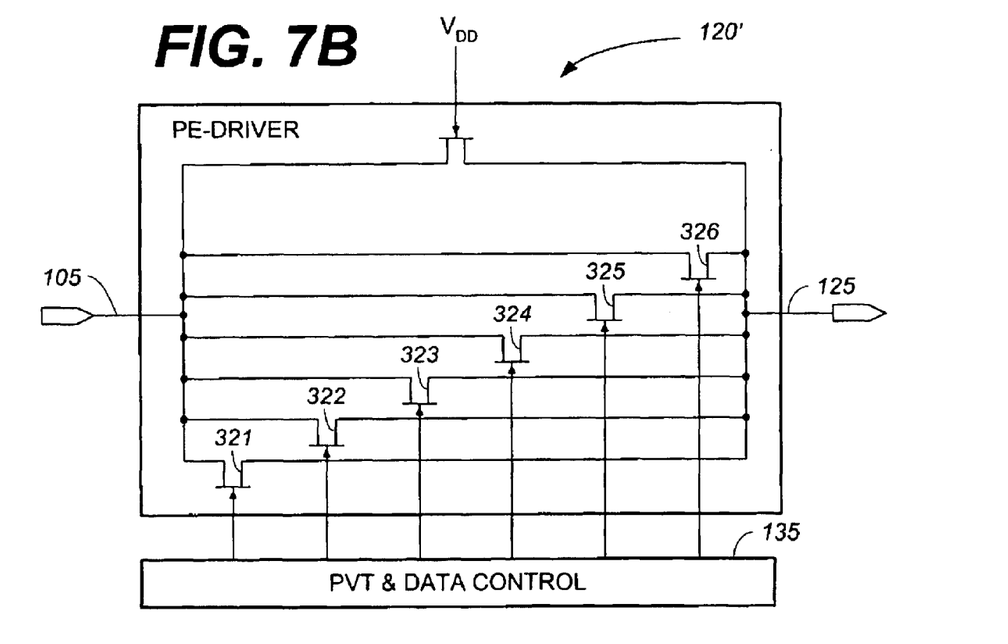
FIG. 7B is a circuit schematic of an alternative embodiment of the pre-emphasis driver of FIG. 5.

Having briefly described the architecture and operation of a preferred embodiment of the pe-driver 120 as illustrated in FIG. 7A, reference is now directed to FIG. 7B, which illustrates an alternative implementation. In this regard, a pe-driver 120' may comprise a FET network as shown in FIG. 7B. The FET network provides a controllably variable impedance, which serves to vary the output impedance of the pe-driver 120' to match a transmission line characteristic impedance. The impedance provided by the FET network is controlled by one or more PVT & data control signals generated by the PVT & data controller 135. As illustrated in the circuit of FIG. 7B, the output of the FET network is routed to the first driver output 145 (FIG. 5) via pe-driver output conductor 125.

Specifically, the FET network is shown in relation to the data input 105, the pe-driver output 125, and the PVT & data controller 135. The FET network includes a plurality of NFET devices 321, 322, 323, 324, 325, and 326 electrically connected in parallel. Each of the NFETs 321–326 may be defined by a channel width that defines the conductance (and therefore resistance) of that NFET device. When turned "on," each NFET passes the voltage from the input data signal 105 to the pe-driver output 125. When more than one of the NFET devices 321–326 is turned "on," they act like resistors, combining in parallel to provide a lower resistance. In this way, the output impedance of the driver circuit is varied. Preferably, the NFET devices 321–326 are designed to have progressively decreasing channel widths, and specifically channel widths that decrease by a factor of two. Thus, for example, the channel width of NFET 321 may be some value X, the channel width of NFET 322 may be approximately ½ X, the channel width of NFET 323 approximately ¼ X, and so on. Therefore, the collective output of the PVT & data controller signals may serve as a digital control word to turn "on" selected NFET devices 321–326 to precisely control the output impedance of the pre-driver 120. It will be appreciated that the circuitry or logic of the PVT & data controller 135 (not shown) will be dependent upon process, voltage, and temperature (PVT), but need not be described herein. As illustrated in FIG. 7B, the FET network is designed such that at least one path is always "on" to permit a signal to pass from the data input signal 105 to the pre-driver output 125.

It should be appreciated that a host of suitable FET channel width relationships as described with regard to the preferred implementation introduced in FIG. 7A may also be applied to the various FET device channel widths in the circuit illustrated in FIG. 7B in order to achieve a number of desired impedance control effects. These and other schemes for varying the various FET device channel widths are deemed within the scope of the present invention.

Figure 8:
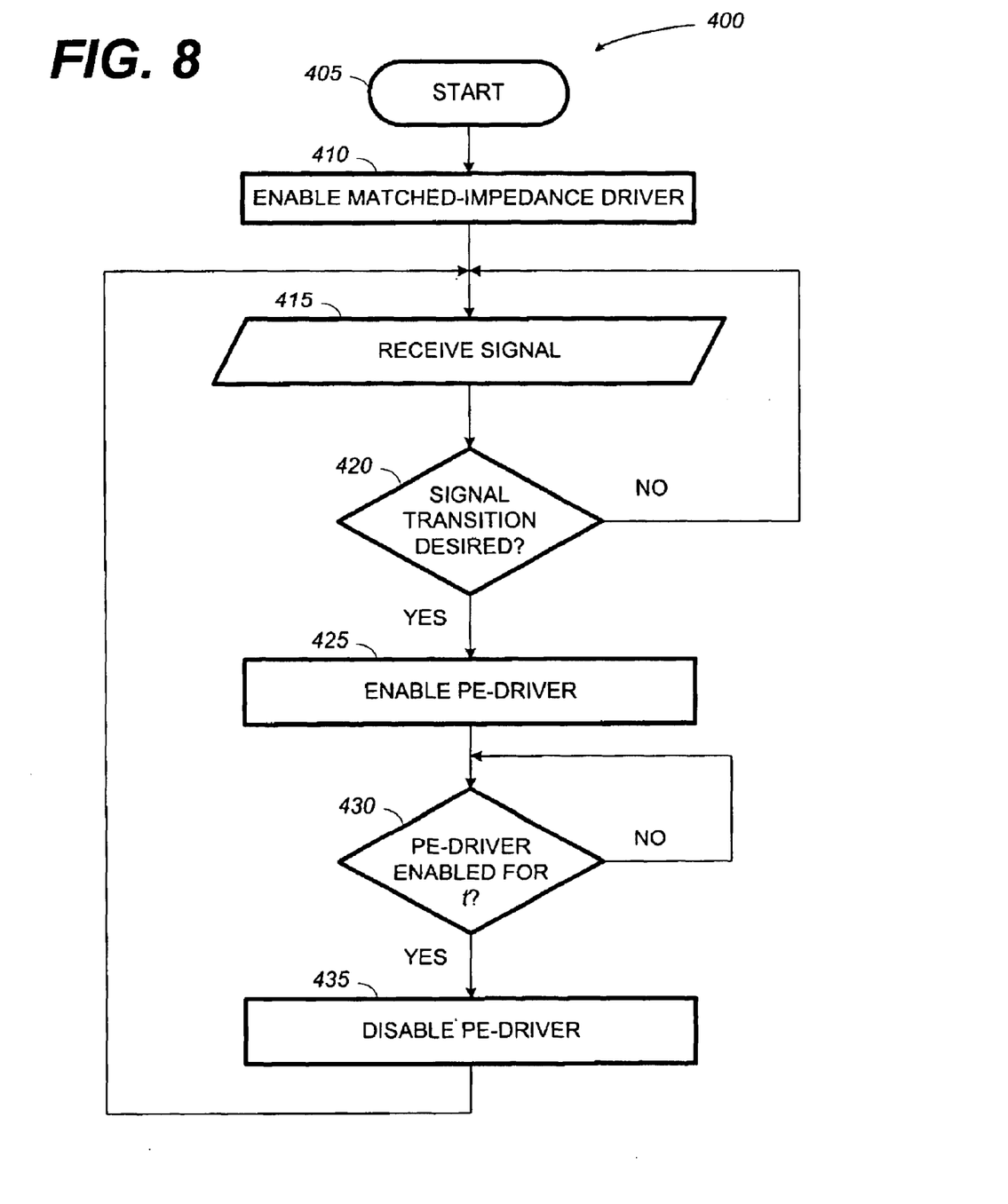
FIG. 8 is a flowchart depicting a method for high-frequency compensation of data and clock signals that may be practiced by the circuit introduced in FIG. 5.

Reference is now directed to FIG. 8 which presents a flowchart depicting a method for high-frequency compensation of data and clock signals that may be practiced by the circuit introduced in FIG. 5. In this regard, the method for high-frequency compensation of data and clock signals 400 may begin with step 405, herein labeled, "Start." Next, in step 410, the method for high-frequency compensation of data and clock signals 400 may enable an impedance-matched driver to generate a signal with enough power to traverse transmission media between a signal source device associated with a first IC device and a designated receiver that may be either a significant distance from the source device on the same IC or associated on a second IC device. The method for high-frequency compensation of data and clock signals 400 may proceed with step 415 where a signal designated for transmission to one or more receivers is received. As illustrated in step 420, a determination may be made if the signal is about to transition to a new signal level. If the determination in step 420 is negative, as indicated by the "No" branch of the flowchart, the method for high-frequency compensation of data and clock signals 400 may continuously repeat steps 415 and 420 until a signal transition is indicated. Otherwise, if the determination in step 420 is affirmative (i.e., the received signal is about to transition to a new signal level), the method for high-frequency compensation of data and clock signals 400 may be configured to perform step 425 where a pre-emphasis driver is enabled.

In accordance with the teachings and concepts of the present invention, the method for high-frequency compensation of data and clock signals 400 may perform a query as illustrated in step 430 to determine if the pe-driver has been enabled for a sufficient duration so as to increase a drive signal comprising the output of the impedance-matched driver enabled in step 410 and the pe-driver output 125. As discussed previously with regard to the high-frequency compensator 100 of FIG. 5 and in accordance with the teachings of the present invention, the pe-driver 120 (FIG. 5) should be disabled (i.e., in an "off" state) before the arrival of a reflected signal to retain the benefit provided by the matched-impedance driver along with the high-frequency content introduced by the low-impedance pe-driver 120. As further illustrated by the flowchart of FIG. 8, if the determination in step 430 is negative (i.e., the pe-driver has not been enabled for a time, t), the method for high-frequency compensation of data and clock signals 400 may be configured to simply repeat the query. It will be appreciated that a suitable delay may be inserted before each repeat performance of the query of step 430. Otherwise, if the determination in step 430 is affirmative, that is the pe-driver has been enabled for a sufficient time, the method for high-frequency compensation of data and clock signals 400 may be configured to disable the pe-driver as indicated in step 435. Thereafter, as shown in the flowchart of FIG. 8, the method for high-frequency compensation of data and clock signals 400 may be configured to repeat steps 415 through 435 as indicated by the flowchart arrow. It will be appreciated by those skilled in the art that the method for high-frequency compensation of data and clock signals 400 may be configured to periodically disable (i.e., turn "off" the matched-impedance driver) and re-enter the flowchart at step 410 in response to an indication that the data signal is no longer required by an associated system.

Any process descriptions or blocks in the flowchart of FIG. 8 should be understood to represent specific logical functions or steps in the method for high-frequency compensation of data and clock signals 400. Alternate implementations are included within the scope of the preferred embodiment of the present invention in which functions may be executed out of order from that shown or discussed, including substantially, concurrently, or in reverse order, depending on the functionality involved, as would be understood by those reasonably skilled in the art of the present invention.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. An output driver for driving a signal, the output driver comprising:

a first driver configured with an input and an output, the first driver having an output impedance selected to match a characteristic impedance of a signal transmission media and an input impedance selected to match at least one receiver; and a second driver electrically coupled in parallel with the first driver, the second driver configured to receive and amplify a signal applied at the input in response to a control signal such that the second driver is turned on in response to a transition of the signal at the input, the second driver remaining on for a portion of the time that the signal applied at input maintains a logic threshold, wherein the second driver modifies the output impedance of the output driver in response to the control signal, the second driver being configured to turn off at a predetermined time in response to the control signal.

2. The driver of claim 1, wherein the second driver has a low output impedance.

3. The driver of claim 1, wherein the second driver comprises a field effect transistor (FET) network interposed between the signal input and the signal output.

4. The driver of claim 2, wherein the control input turns off the second driver prior to the return of an amplified signal reflected due to the impedance mismatch between the signal transmission media and the at least one receiver.

5. The driver of claim 3, wherein the control input comprises a plurality of signals generated by a control circuit.

6. The driver of claim 5, wherein the PET network comprises a plurality of p-channel FETs (PFETs) electrically coupled in parallel, wherein a source node of each of the plurality of PFETS are electrically coupled together and a drain node of each of the plurality of PEETS are electrically coupled together.

7. The driver of claim 5, wherein the FET network comprises a plurality of n-channel FETs (NFETS) electrically coupled in parallel, wherein a source node of each of the plurality of NFETS are electrically coupled together and a drain node of each of the plurality of NFETS are electrically coupled together.

8. The driver of claim 5, wherein the control circuit comprises a plurality of output signals that are input to the FET network, whereby the control circuit output signals serve to controllably vary the output impedance of the second driver.

9. The driver of claim 5, wherein the control circuit comprises a plurality of output signals that are input to the FET network, whereby the control circuit output signals serve to controllably vary the output signal strength from the second driver.

10. The driver of claim 5, wherein the FET network comprises a plurality of p-channel FETs (PFETs) and n-channel FETs (NFETs), wherein a PFET/NFET pair electrically coupled in series in a push/pull configuration and wherein a drain node of each of the plurality of PFETs are electrically coupled together with a source node of each of the plurality of NFETs to form a second driver output signal.

11. The driver of claim 6, wherein a gate node of each of the plurality of p-channel FETs (PFETs) is electrically coupled to one of the plurality of signals generated by the control circuit.

12. The driver of claim 7, wherein a gate node of each of the plurality of n-channel FETs (NFETs) is electrically coupled to one of the plurality of signals generated by the control circuit.

13. The driver of claim 8, wherein the plurality of p-channel FETs (PFETs) are variably sized.

14. The driver of claim 8, wherein the plurality of p-channel FETs (PFETs), excluding a first PFET closest to the signal input, are sized to have width dimensions that progressively vary by a factor of 2.

15. The driver of claim 9, wherein the plurality of n-channel FETs (NFETs) are variably sized.

16. The driver of claim 9, wherein the plurality of n-channel FETs (NFETs), excluding a first NFET closest to the signal input, are sized to have width dimensions that progressively vary by a factor of 2.

17. The driver of claim 10, wherein the plurality of p-channel FETs (PFETs), excluding a first PFET closest to the signal input, are sized to have progressively smaller width dimensions.

18. The driver of claim 10, wherein the plurality of n-channel FETs (NFETs), excluding a first NFET closest to the signal input, are sized to have progressively smaller width dimensions.

19. The driver of claim 12, wherein the plurality of n-channel FETS (NFETs), excluding a first NFET closest to the signal input, are sized to have progressively smaller width dimensions.

20. A method for high-frequency compensation for data and clock signals, the method comprising:
providing a data signal at the input of a matched-impedance driver having an output impedance selected to match a characteristic impedance of a signal transmission media and an input impedance selected to match at least one receiver;
providing a low-impedance driver in parallel with the matched-impedance driver;
supplying a control signal to the low-impedance driver such that the low-impedance driver is turned on when the data signal transitions and the low-impedance driver is turned off at a predetermined time in response to the control signal before an impedance mismatch induced reflected signal returns to the output of the matched-impedance driver; and
modifying the output impedance of the low-impedance driver in response to the control signal.

21. The method of claim 20, wherein the matched-impedance driver is on when an input signal is present at the input of the matched-impedance driver.

22. The method of claim 20, wherein the low-impedance driver comprises a tri-state device that outputs a signal having a logic high value when an input signal applied at the input to the matched-impedance driver is logically high, a logic low value when an input signal applied to the input of the matched-impedance driver is logically low, and wherein no signal is present at the output of the low-impedance driver when it is turned off.

23. The method of claim 20, wherein the control signal is generated by a controller responsive to manufacturing process variation and temperature of the low-impedance driver.

24. An improved output driver for driving a signal, the output driver comprising:
means for matching the characteristic impedance of a transmission media designated to distribute the signal;
means for matching the characteristic impedance of at least one receiver;
means for inserting high-frequency content into the signal; and
means for turning off the output driver at a predetermined time in response to a control signal.

25. The driver of claim 24, wherein the matching means comprises a first driver with an output impedance that substantially matches the characteristic impedance of the transmission media.

26. The driver of claim 24, wherein the transmission media comprises a printed circuit board trace.

27. The driver of claim 24, wherein the means for inserting high-frequency content comprises a low-impedance driver responsive to a control signal that turns the low-impedance driver on such that the rising edge of a low-impedance driver output pulse coincides with a rising edge of a signal transition and wherein the control signal turns the low-impedance driver off before a reflected signal arrives at the output of the first driver.

28. The driver of claim 24, wherein the means for inserting high-frequency content comprises a low-impedance driver responsive to a control signal that turns the low-impedance driver on such that the rising edge of a low-impedance driver output pulse coincides with a falling edge of a signal transition and wherein the control signal turns the low-impedance driver off before a reflected signal arrives at the output of the first driver.

* * * * *